(12) United States Patent
Nakamura et al.

(10) Patent No.: US 8,084,717 B2
(45) Date of Patent: Dec. 27, 2011

(54) REFLOW FURNACE

(75) Inventors: Hideki Nakamura, Koshigaya (JP); Atsushi Obara, Iwate (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 631 days.

(21) Appl. No.: 11/659,235

(22) PCT Filed: Aug. 3, 2005

(86) PCT No.: PCT/JP2005/014216
§ 371 (c)(1),
(2), (4) Date: Feb. 3, 2009

(87) PCT Pub. No.: WO2006/013895
PCT Pub. Date: Feb. 9, 2006

(65) Prior Publication Data
US 2009/0134142 A1 May 28, 2009

(30) Foreign Application Priority Data

Aug. 4, 2004 (JP) .................. 2004-228072
Mar. 14, 2005 (JP) .................. 2005-070208

(51) Int. Cl.
*F27B 14/00* (2006.01)
*B01J 3/04* (2006.01)

(52) U.S. Cl. ........ 219/420; 219/388; 432/120; 432/145; 432/144; 432/148; 432/59

(58) Field of Classification Search .......... 219/420, 219/413; 432/120, 144–145, 148, 59, 8
See application file for complete search history.

(56) References Cited

U.S. PATENT DOCUMENTS 5,567,151 A 10/1996 Mizoguchi et al. .......... 432/145

FOREIGN PATENT DOCUMENTS

| JP | 02137691 | 5/1990 |
|---|---|---|
| JP | 02303674 | 12/1990 |
| JP | 2001144426 | 5/2001 |
| JP | 2001144427 | 5/2001 |
| JP | 2001326455 | 11/2001 |
| JP | 2002198642 | 7/2002 |
| JP | 2002331357 | 11/2002 |
| JP | 2003332725 | 11/2003 |

*Primary Examiner* — Shawntina Fuqua
(74) *Attorney, Agent, or Firm* — Michael Tobias

(57) ABSTRACT

The suction ports of a hot air blowing heater are arranged in a zigzag shape crossing the direction of travel of a printed circuit board, and hot air discharge nozzles project from inside or alongside the suction ports. Accordingly, in the reflow furnace according to the present invention, hot air discharged from the hot air discharge nozzles does not collide with hot air sucked into the suction ports, and turbulence does not take place.

12 Claims, 14 Drawing Sheets

REFLOW FURNACE

TECHNICAL FIELD

This invention relates to a reflow furnace for carrying out soldering by melting a solder paste applied to a printed circuit board.

BACKGROUND ART

Soldering of printed circuit boards and electronic parts to each other using a solder paste is usually carried out using a reflow furnace. A reflow furnace is constituted by a tunnel-shaped muffle having a preheating zone, a main heating zone, and a cooling zone inside it. A heating means is installed in the preheating zone and the main heating zone, and a cooling means is installed inside the cooling zone.

Heating means used in reflow furnaces include infrared heaters and hot air blowing heaters. With an infrared heater, infrared rays penetrate to the interior of crevices in a printed circuit board and electronic parts and melt the solder paste applied to portions to be soldered. However, infrared rays travel in a straight line, so an infrared heater has the problem that it cannot sufficiently heat portions to be soldered located in the shadows of electronic parts.

With a hot air blowing heater, hot air undergoes convection inside a muffle and penetrates to portions in the shadows of electronic parts and narrow crevices. Therefore, it has the advantage over an infrared heater that it can more uniformly heat the entirety of a printed circuit board than can an infrared heater, and it is much used today in reflow furnaces.

A hot air blowing heater installed in a conventional reflow furnace has hot air discharge ports with a large area along with hot air suction ports with a small area formed in the vicinity of the hot air discharge ports in the same plane. A large amount of hot air is blown out of the hot air discharge ports having a large area toward a printed circuit board such that a large area of the printed circuit board is heated at the same time.

It has been thought that a printed circuit board can be uniformly heated by blowing hot air in this manner from discharge ports having a large area. However, in recent experiments, it was found that a printed circuit board cannot be uniformly heated even if hot air is blown from discharge ports having a large area. Namely, after a printed circuit board is heated with hot air blown from hot air discharge ports having a large area, the printed circuit board advances and reaches the suction ports, where not only is the printed circuit board not struck by hot air, but suction of hot air into the suction ports causes the printed circuit board to cool. If the temperature profile in a reflow furnace having hot air discharge ports with a large area adjoining hot air suction ports having a small area in this manner is graphed, it is found that the temperature rises at the hot air discharge ports but decreases at the suction ports.

If the temperature in the preheating zone and the main heating zone fluctuates in this manner, a printed circuit board is not uniformly heated, and local overheating or underheating may take place to such an extent that electronic parts undergo thermal damage or solder paste is unmelted.

In light of such problems of reflow furnaces in which hot air is discharged from discharge ports having a large area, reflow furnaces have been proposed in which a large number of hot air discharge ports having a small area are provided along with a large number of hot air suction ports located in the vicinity of the hot air discharge ports (Patent Documents 1-7).

However, in the reflow furnaces of Patent Documents 1, 2, 4, and 5, for example, although the entirety of a printed circuit board can be uniformly heated because of discharge ports having a small area which are scattered, hot air which is blown from the large number of discharge ports is sucked in by suction ports in many locations since the suction ports are also scattered. As a result, the hot air which is discharged and the hot air which is sucked in strike against each other, and turbulence sometimes occurs in the muffle. The occurrence of turbulence in the muffle may cause heating irregularities, and in the case of an inert atmosphere using nitrogen gas, it may cause the oxygen concentration of the atmosphere to fluctuate due to infiltration of oxygen from outside the furnace.

The reflow furnace of Patent Document 3 has a series of discharge ports and a series of suction ports provided alongside the discharge ports, and therefore turbulence is not caused by hot air which is discharged from the discharge ports colliding with hot air which is sucked in by the suction ports. However, the reflow furnace of Patent Document 3 has a series of discharge ports arranged in the shape of an X or a Z or in a zigzag shape with respect to the direction of travel of a printed circuit board, and there are locations in which no discharge ports are present. Therefore, a printed circuit board is not adequately heated in locations where discharge ports are not present, and heating irregularities may end up developing.

Patent Documents 6 and 7 merely disclose hot air discharge nozzles which are provided so as to project from a suction plate having suction ports.

Patent Document 1: JP H02-303674 A1
Patent Document 2: JP 2001-144426 A1
Patent Document 3: JP 2001-144427 A1
Patent Document 4: JP 2001-326455 A1
Patent Document 5: JP 2002-198642 A1
Patent Document 6: JP 2002-331357 A1
Patent Document 7: JP 2003-332725 A1

DISCLOSURE OF THE INVENTION

In a conventional reflow furnace of the type having suction ports provided in the vicinity of hot air discharge ports, even when various dispositions of the ports were attempted, there were problems such as that turbulence occurred inside the muffle and thus outside air infiltrated to increase the oxygen concentration in the atmosphere of an inert gas when such a gas was used, or that the entirety of the printed circuit board could not be uniformly heated.

The present invention is intended to provide a reflow furnace which can not only uniformly heat a printed circuit board because heating irregularities of a printed circuit board can be avoided when using a hot air blowing heater as a heating means but which can stabilize the oxygen concentration in an inert atmosphere when such an atmosphere is used.

The present inventors discovered that in a reflow furnace equipped with hot air blowing heaters, by installing discharge nozzles through which hot air from hot air blowing heaters is discharged and suction ports through which hot air is sucked both in a zigzag shape so as to cross the direction of travel of a printed circuit board and preferably so as to extend continuously, and by installing hot air discharge nozzles so as to project from the front surface of the hot air blowing heaters (referred to below as the heater surface), the entirety of a printed circuit board can be heated without irregularities and turbulence of hot air does not take place in the reflow furnace after it heats a printed circuit board, and they completed the present invention.

In addition, the present inventors found that if the hot air discharge nozzles which are provided together with suction ports in this manner are arranged in parallel in a plurality of zigzag-shaped strips in a direction crossing the direction of travel of a printed circuit board and discharge holes constituting each nozzle are arranged in a staggered shape with respect to the direction of travel of a printed circuit board, i.e., if they are arranged such that the discharge holes of nozzles in adjoining strips are not aligned but are arranged such that the discharge holes of nozzles separated by at least one strip are aligned, uneven heating of a printed circuit board does not take place and turbulence does not occur, and they completed the present invention.

Accordingly, the present invention is a reflow furnace comprising a preheating zone, a main heating zone, and a cooling zone and having at least one heater in the upper portion or the upper and lower portions of the preheating zone and the main heating zone, characterized in that the heater is a hot air blowing heater having a fan and an electric heater inside it and having a plurality of hot air discharge nozzles on its front surface, the hot air discharge nozzles project from the front surface of the hot air blowing heater, the hot air discharge nozzles are arranged in a zigzag shape which crosses the direction of travel of a printed circuit board, hot air suction ports which extend across the direction of travel of a printed circuit board are provided in the vicinity of the hot air discharge nozzles, the suction ports communicate with the suction side of the fan, and the discharge nozzles communicate with the discharge side of the fan.

In another mode, the present invention is a reflow furnace comprising a preheating zone, a main heating zone, and a cooling zone, characterized in that a plurality of hot air discharge nozzles which project from a heater surface are provided in the upper portion or the upper and lower portions of the preheating zone and the main heating zone and are arranged in a plurality of zigzag-shaped strips which cross the direction of travel of a printed circuit board, hot air suction ports are formed in the heater surface between the discharge nozzles and extend so as to cross the direction of travel of a printed circuit board, a large number of hot air discharge holes are formed at intervals in each strip of the discharge nozzles, and the large number of discharge holes in the discharge nozzles are not aligned in the direction of travel of the printed circuit board with the large number of discharge holes in the adjoining strip but are aligned with the discharge holes in a discharge nozzle separated by at least one strip.

According to the present invention, nozzles are formed in a zigzag shape, preferably in a plurality of strips, crossing the direction of travel of a printed circuit board, so hot air always contacts any portion of a printed circuit board traveling within a reflow furnace and the printed circuit board is uniformly heated.

In addition, when a reflow furnace according to the present invention employs discharge holes with a fast blowing velocity as hot air discharge ports, rapid heating of a printed circuit board can be accomplished, thereby improving the productivity of soldering.

Even though a reflow furnace according to the present invention utilizes discharge holes of small area with which unheated portions can easily develop, the locations in which the discharge holes are formed are not aligned with the locations of the discharge holes in the adjoining discharge nozzle but are aligned with the locations of the discharge holes in a discharge nozzle separated therefrom by at least one strip. Therefore, even if the nozzle in a first strip produces unheated portions, the nozzle in the next strip heats the unheated portions produced by the first strip, and as a whole, unheated portions can be eliminated overall and uniform heating is made possible.

In a reflow furnace according to the present invention, hot air discharge nozzles project from a heater surface so that heating regions which are elongated in the transverse direction and have a uniform temperature are formed between nozzles in adjoining strips, and the heating regions carry out uniform heating of an advancing printed circuit board.

Also, in a reflow furnace according to the present invention, since the hot air in the heating regions undergoes self-convection, infiltration of outside air does not occur, and a low oxygen concentration can be stably maintained.

Furthermore, in a reflow furnace according to the present invention, the suction ports have the same zigzag shape as the hot air discharge nozzles and are formed in the vicinity of the hot air discharge nozzles. Therefore, the hot air which is blown from the discharge nozzles contacts a printed circuit board and heats the printed circuit board, and then all of the hot air is sucked into the suction ports, so it does not cause turbulence.

Accordingly, there is almost no infiltration of outside air when a reflow furnace according to the present invention uses an inert gas, and a low oxygen concentration can be stably maintained.

In a reflow furnace according to the present invention, heating of a printed circuit board is made even more uniform when zigzag-shaped discharge nozzles are erected inside zigzag-shaped suction ports, or when suction ports and discharge nozzles are alternatingly disposed adjoining each other in a zigzag shape.

Also, in a reflow furnace according to the present invention, zigzag-shaped discharge nozzles may have a continuous shape, but fabricating the discharge nozzles in a continuous zigzag shape is time-consuming. Therefore, a plurality of discharge nozzles having a rectangular transverse cross section can be assembled to form a zigzag shape.

In the present invention, hot air discharge nozzles are installed in the upper portion or the upper and lower portions of a preheating zone and a main heating zone. Thus, they may be installed in just the upper portion. Usually a printed circuit board has solder paste applied to its upper portion, and in many cases electronic parts are mounted on the portions to which paste is applied. Therefore, the solder paste can be melted by heating just the upper portion of the printed circuit board with hot air. However, in order to uniformly heat the entirety of a printed circuit broad, it is preferable to also heat the lower portion of the printed circuit board. In this case, instead of using hot air blown from zigzag-shaped nozzles employed in the present invention, it is possible to use hot air blown from nozzles used in a conventional reflow furnace, or heating may be performed with far infrared rays.

Even more uniform heating becomes possible if the multiple strips of nozzles arranged in a zigzag shape which are used in the present invention are installed in both the upper and lower portions.

In another mode of the present invention, discharge nozzles of a hot air blowing heater used in a reflow furnace may be nozzles provided in the end surface of a plate or plates which project in the form of a wall (referred to below simply as a plate-shaped nozzle). This type of plate-shaped nozzle may be a slit nozzle formed by two opposing plates with its top end being opened, or the open top end may be covered with a suitable perforated plate or slotted plate to constitute a hot air discharge nozzle.

Of course, in these cases as well, suction ports are formed in the heater surface between adjacent strips of the plate-shaped nozzles. The suction ports may be formed in a zigzag shape alongside the plate-shaped nozzles, or they may be formed in a zigzag shape approximately midway between adjacent strips of the plate-shaped nozzles. Suction ports formed in the heater surface preferably have a zigzag shape with the same pitch as the plate-shaped nozzles, but other shapes are possible. For example, suction ports may be formed by a punched plate having a large number of holes formed in the heater surface, or they may have the shape of a drainboard having a large number of slits formed in. A punched plate or a drainboard-shaped plate may be a commercially available one, thereby saving the labor required to form suction ports when manufacturing a hot air blowing heater.

A plate-shaped nozzle of a hot air blowing heater used in a reflow furnace according to the present invention may also be formed using a solid thick-walled plate having a large number of discharge holes bored therethrough. In order to uniformly heat the entirety of a printed circuit board, it has been thought better to use long continuous slits instead of holes as hot air discharge ports. This is because slits have no gaps where hot air is not discharged, so uniform heating of the entirety of a printed circuit board can be carried out without causing unheated portions. However, not only uniform heating but also productivity are demanded of recent reflow furnaces, and slits have problems with respect to productivity. This is because slits have a large open area, so the speed at which hot air is blown from the slits is slow. If the blowing speed of hot air is slow, rapid heating cannot be performed. Therefore, with slits, heating must be carried out using a slow conveyor speed. As a result, problems develop with respect to productivity.

Discharge ports in the form of discharge holes have a small open area, so the speed of discharge of hot air is extremely fast compared to that for slits. To that extent, rapid heating becomes possible, and they provide excellent productivity. Discharge holes provide sufficient heating immediately below the discharge holes, but in regions which are not immediately below the holes, the temperature is lower than immediately below the holes, and thus nonuniform heating occurs. Accordingly, it has been thought to be difficult to perform uniform heating with hot air blowing heaters using discharge holes.

However, a hot air blowing heater used in the present invention can achieve uniform heating in spite of using discharge holes, which provide excellent productivity. To that end, each plate-shaped nozzle in multiple strips of nozzles has a large number of discharge holes bored therein, and preferably, the discharge holes in adjacent strips of plate-shaped nozzles are not aligned with each other in the direction of travel of a printed circuit board, but discharge holes in plate-shaped nozzles spaced by at least one strip are aligned with each other. Thus, by arranging the discharge holes in adjacent strips of the plate-shaped nozzles so as not be aligned with each other, even if low temperature portions develop in regions which are not immediately below the discharge holes in a first strip of the plate-shaped nozzle, the discharge holes in the next strip of the plate-shaped nozzle strike the low temperature portions with hot air and raise their temperature.

In the present invention, plate-shaped nozzles of a hot air blowing heater project from a heater surface, so a region which is surrounded by a pair of adjacent plate-shaped nozzles, the heater surface, and a printed circuit board becomes a heating region of a constant temperature. In the heating region, hot air which is blown from the discharge holes of the projecting plate-shaped nozzle strikes the printed circuit board, and when the hot air returns to the suction ports formed in the heater surface, the heat in the heating region is confined and becomes a constant temperature. Each heating region extends lengthily in the transverse direction with respect to the direction of travel of a printed circuit board, and the heating regions are present in succession as a printed circuit board advances. Accordingly, a printed circuit board which is transported by a conveyor is successively heated over its entirety by heating regions which are elongated in the transverse direction with respect to the direction of travel.

The discharge holes which are formed in the plate-shaped nozzles of the hot air blowing heater used in the present invention can have any shape, such as circular, elliptical, or rectangular. Discharge holes are basically used in order to increase the blowing speed of hot air, and their shape can be suitably selected in view of the ease of fabrication and the region to be contacted by hot air. A circular shape is easy to form, while an elliptical or a rectangular shape expands the region which is contacted by hot air and thus further reduces unheated portions.

BEST MODE FOR CARRYING OUT THE INVENTION

Below, a reflow furnace according to the present invention will be explained based on the drawings.

Figure 1:
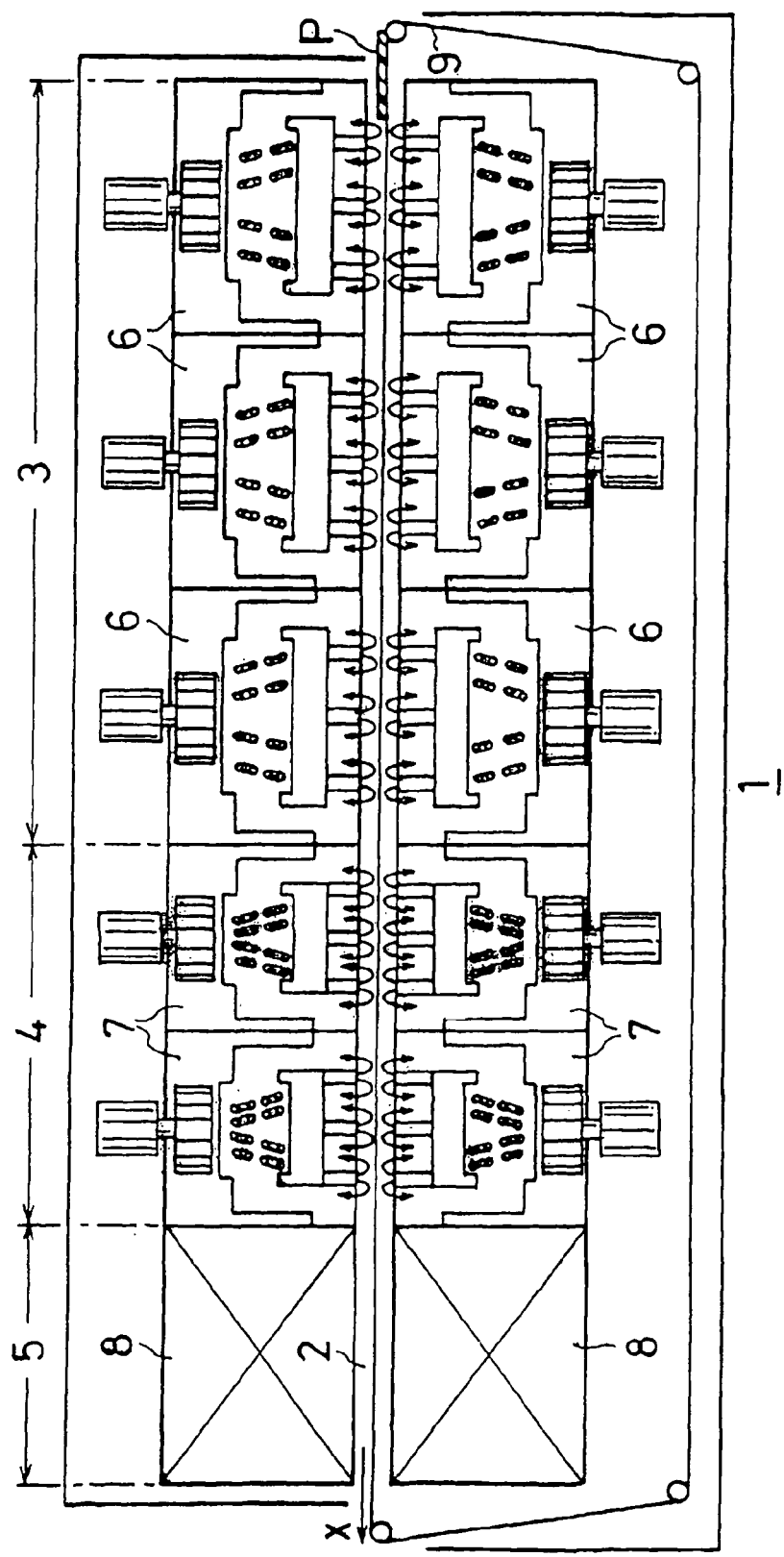
FIG. 1 is a front cross-sectional view of a reflow furnace according to the present invention.
Figure 2:
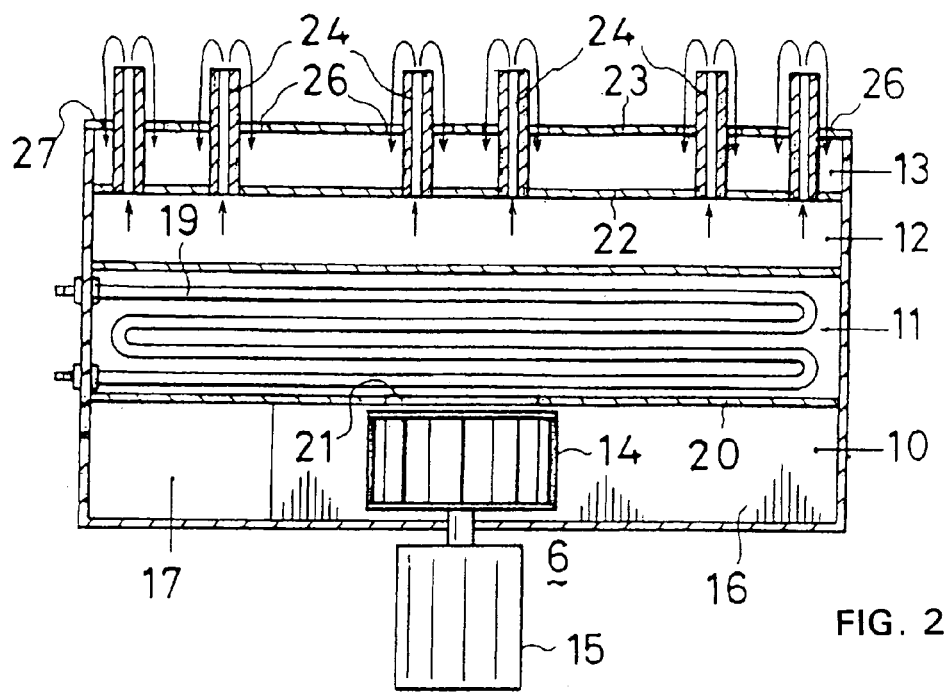
FIG. 2 is a front cross-sectional view of a hot air blowing heater installed in a reflow furnace according to the present invention.
Figure 3:
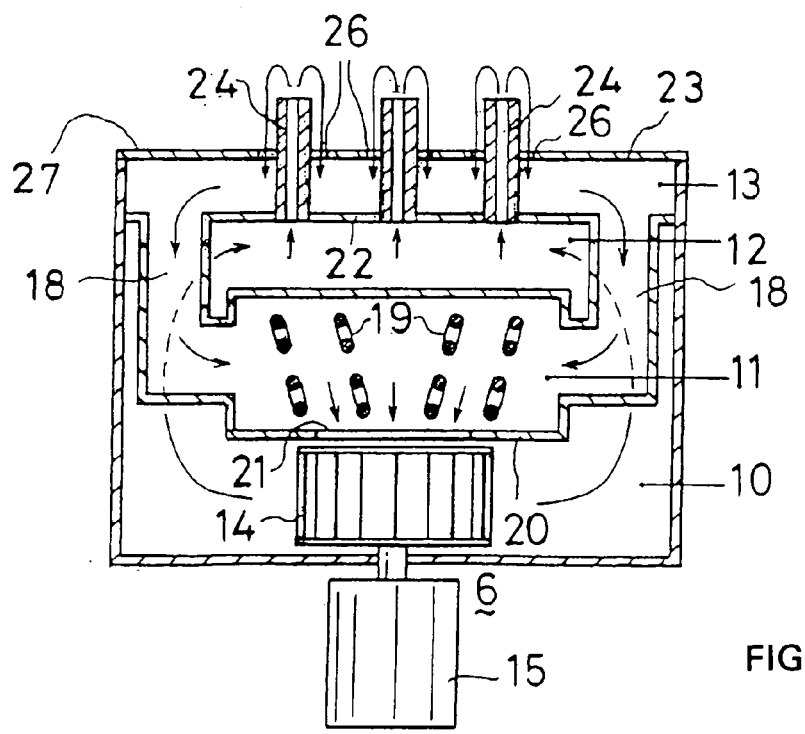
FIG. 3 is a side cross-sectional view of FIG. 2.
Figure 4:
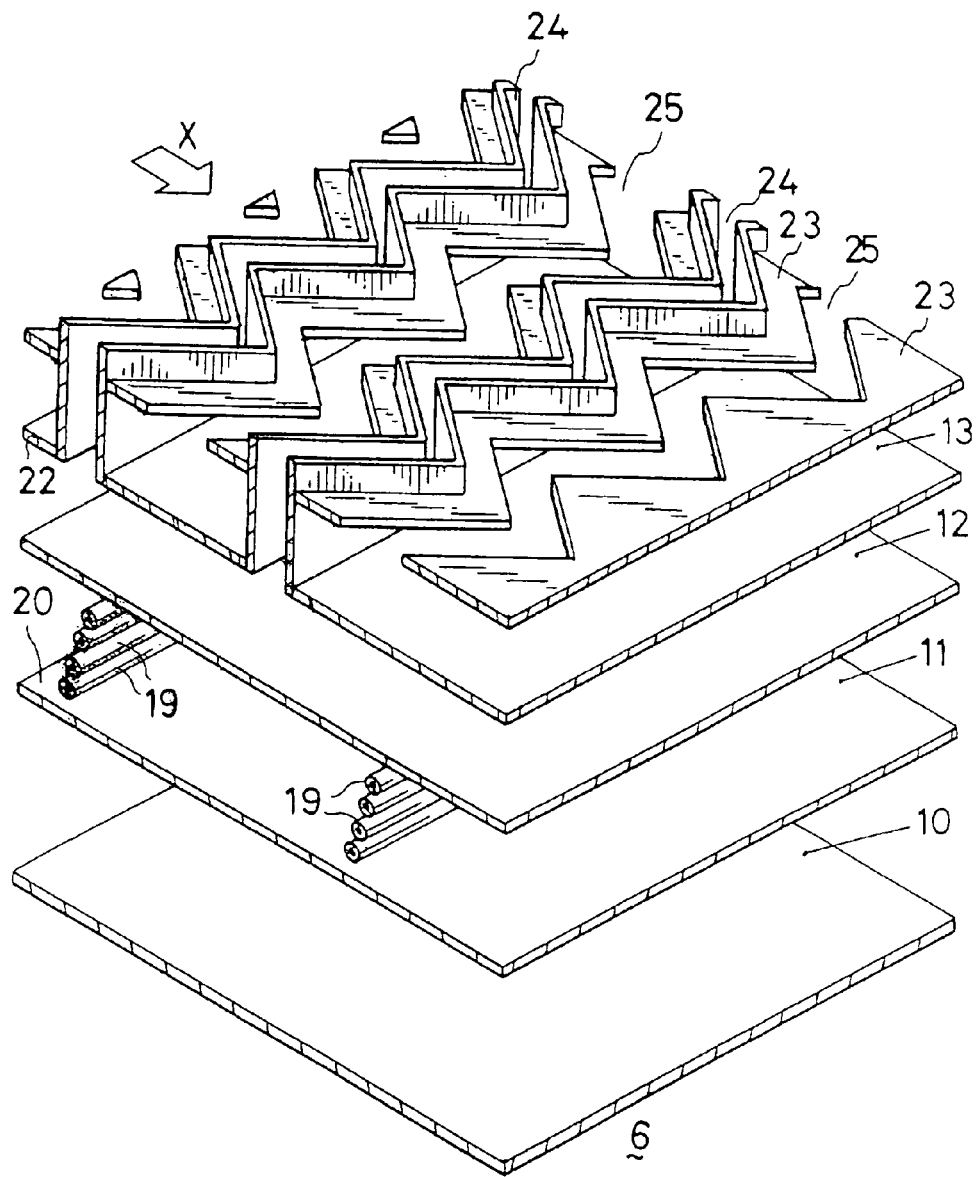
FIG. 4 is a perspective view of a portion of a hot air blowing heater installed in a reflow furnace according to the present invention.
Figure 5:
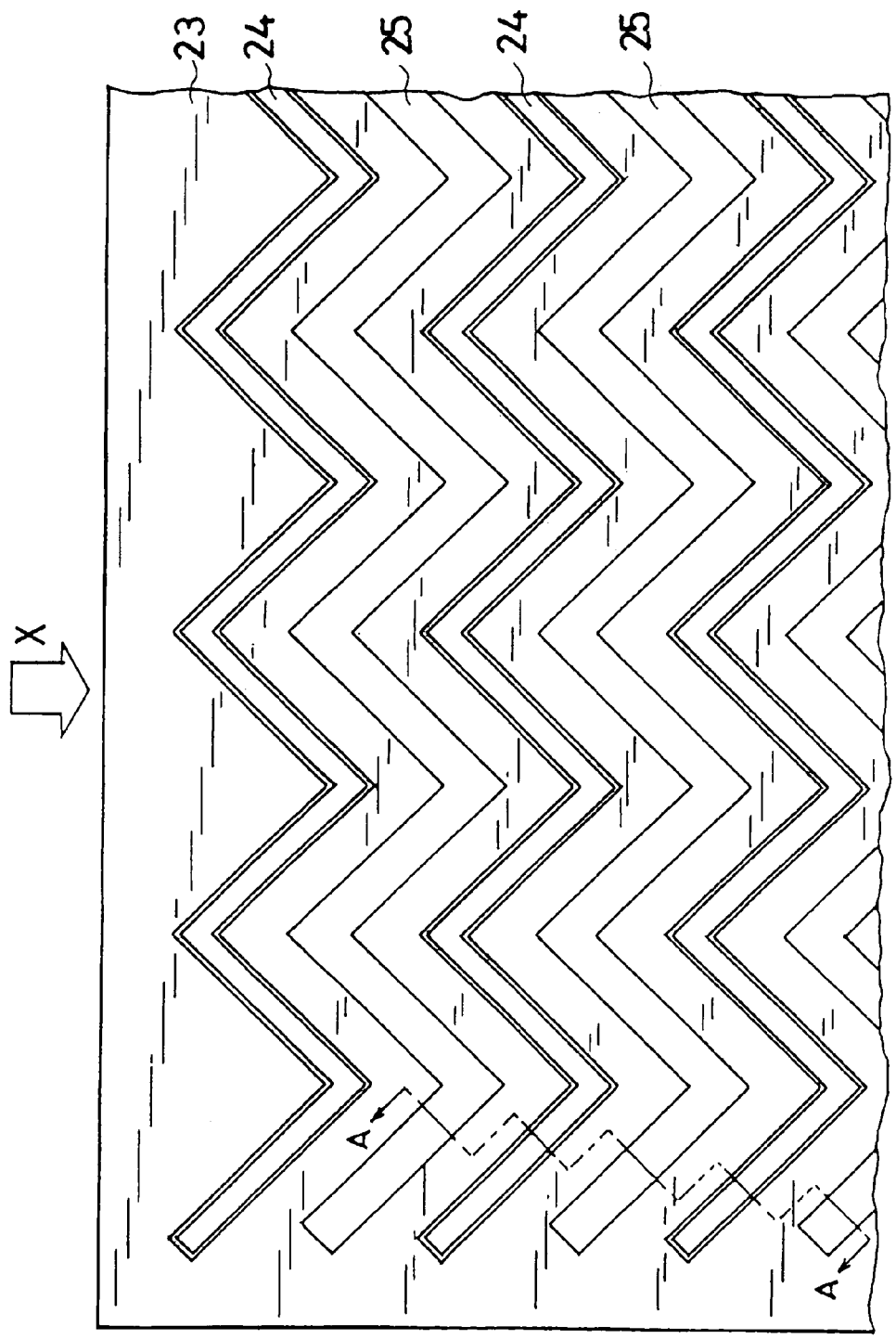
FIG. 5 is a plan view of FIG. 4.
Figure 6:
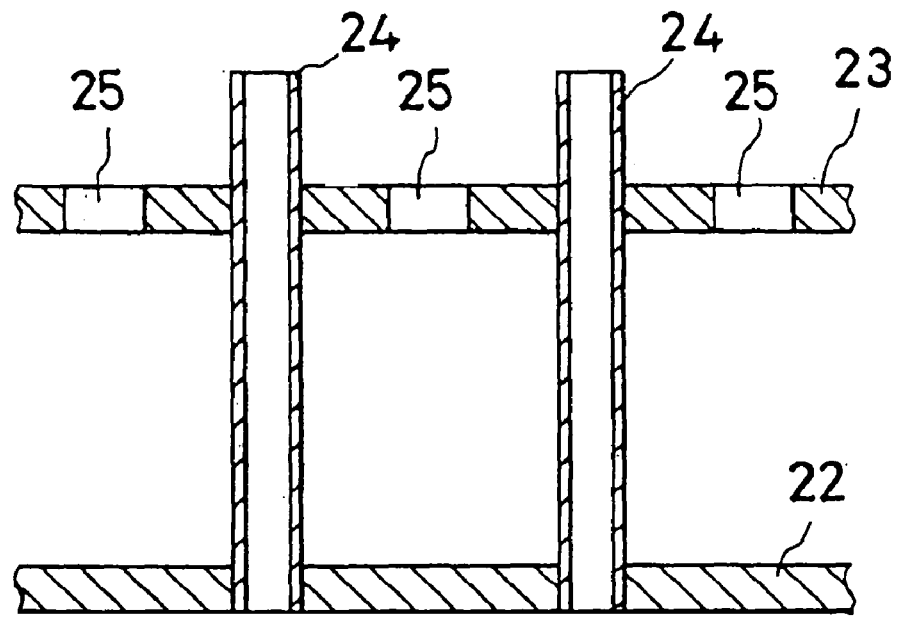
FIG. 6 is a cross-sectional view taken along line A-A of FIG. 5.
Figure 7:
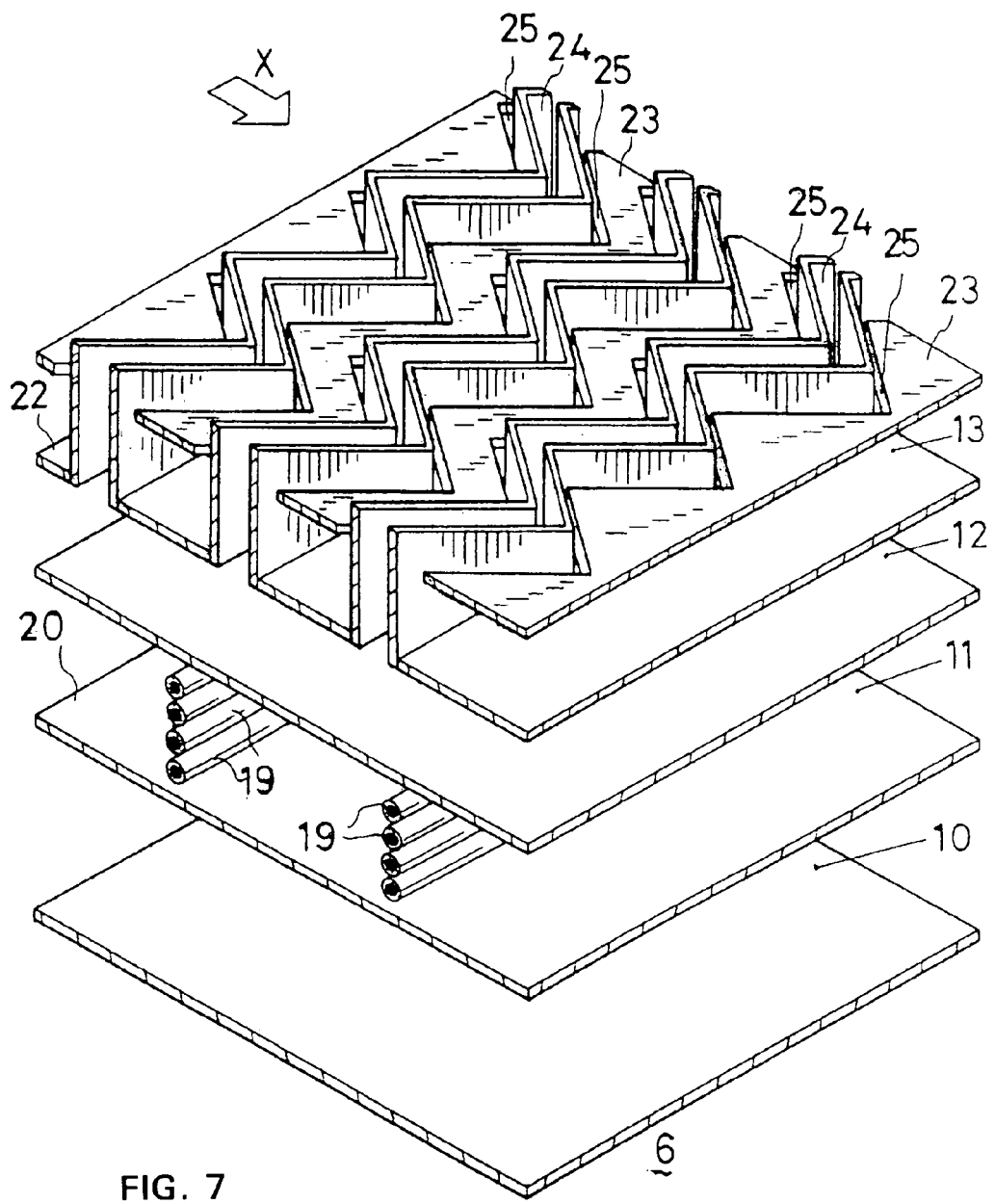
FIG. 7 is perspective view of a portion of another mode of a hot air blowing heater installed in a reflow furnace according to the present invention.
Figure 8:
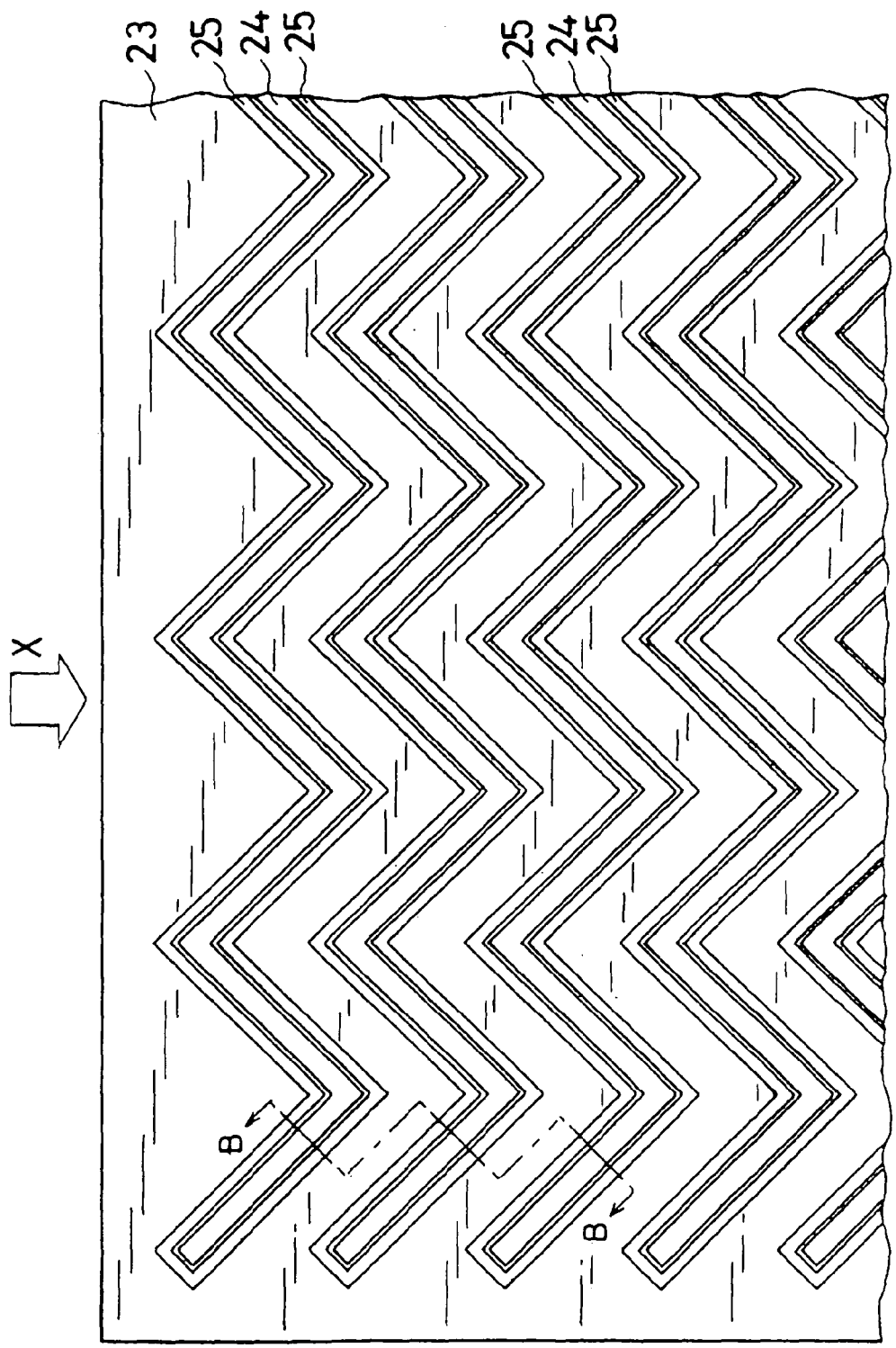
FIG. 8 is a plan view of FIG. 7.
Figure 9:
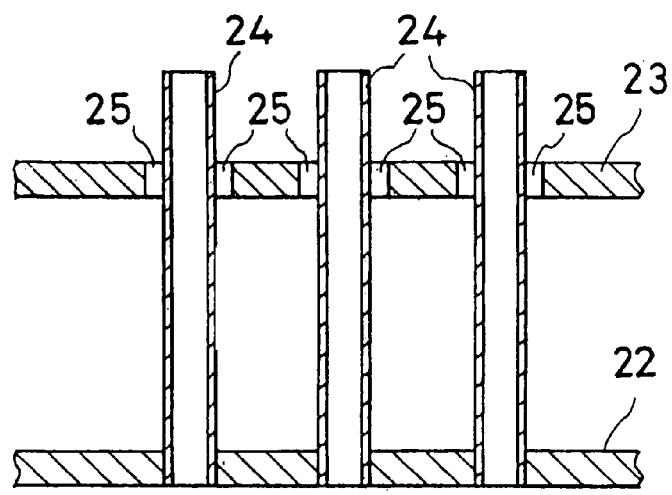
FIG. 9 is a cross-sectional view taken along line B-B of FIG. 8.
Figure 10:
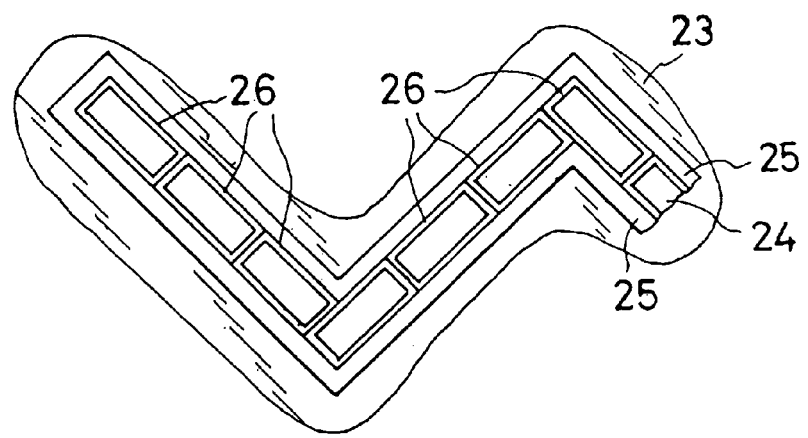
FIG. 10 is an enlarged plan view of a portion of a mode in which the hot air discharge nozzles of FIG. 5 are formed from rectangular pipes.
Figure 11:
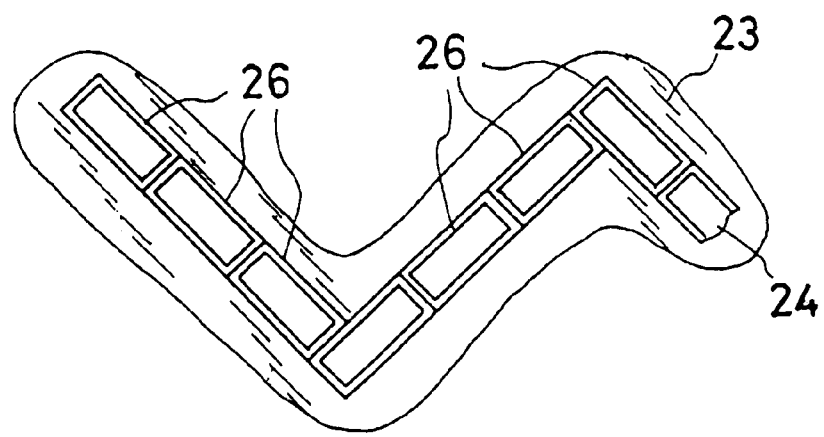
FIG. 11 is an enlarged plan view of a portion of a mode in which the hot air discharge nozzles of FIG. 8 are formed from rectangular pipes.
Figure 12:
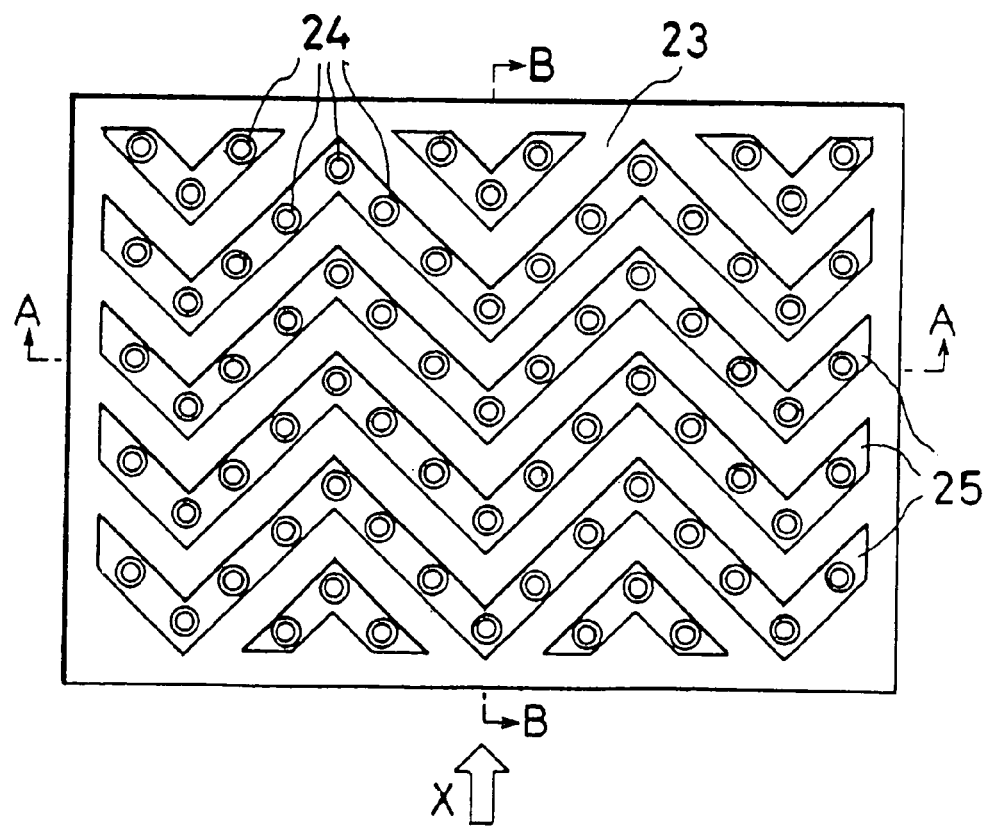
FIG. 12 is a plan view of a portion of a mode in which the rectangular pipes of FIG. 11 are replaced by a large number of round pipes.
Figure 13:
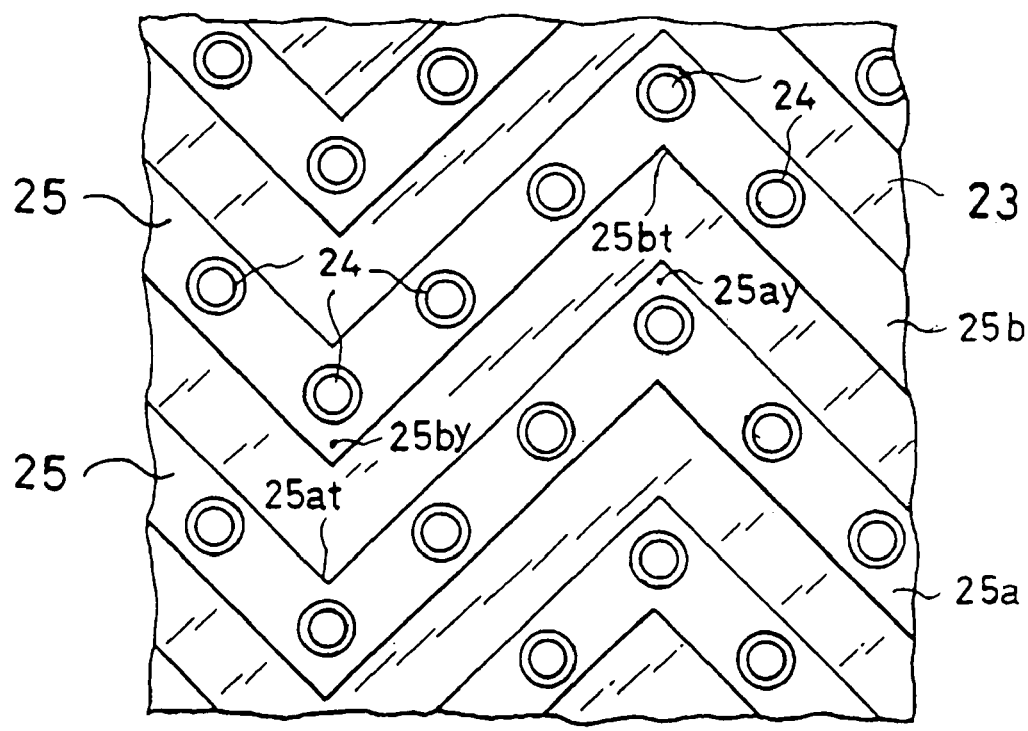
FIG. 13 is an enlarged view of a portion of FIG. 12.

FIG. 1 is a front cross-sectional view of a reflow furnace according to the present invention, FIG. 2 is a front cross-sectional view of a hot air blowing heater installed in a reflow furnace according to the present invention, FIG. 3 is side cross-sectional view thereof, FIG. 4 is a partial perspective view of a hot air blowing heater installed in a reflow furnace according to the present invention, FIG. 5 is a plan view of FIG. 4, FIG. 6 is a cross-sectional view taken along line A-A of FIG. 5, FIG. 7 is a partial perspective view of a hot air blowing heater having a different structure installed in a reflow furnace according to the present invention, FIG. 8 is a plan view of FIG. 7, FIG. 9 is a cross-sectional view taken along line B-B of FIG. 8, FIG. 10 is a partial enlarged plan view of a mode in which the hot air discharge nozzles of FIG. 5 are formed from rectangular pipes, FIG. 11 is a partial enlarged plan view of a mode in which the hot air discharge nozzles of FIG. 8 are formed from rectangular pipes, FIG. 12 is a plan view of a mode in which hot air discharge nozzles are formed from round pipes, and FIG. 13 is a partial enlarged plan view thereof.

As shown in FIG. 1, a reflow furnace 1 according to the present invention has a tunnel-shaped muffle 2 extending in the lengthwise direction of the furnace. The muffle is divided into a preheating zone 3, a main heating zone 4, and a cooling zone 5. A plurality (three pairs) of hot air blowing heaters 6 is installed in the upper and lower portions of the preheating zone 3, and a plurality (two pairs) of hot air blowing heaters 7 is installed in the upper and lower portions of the main heating zone 4. The hot air blowing heaters 6 installed in the preheating zone 3 and the hot air blowing heaters 7 installed in the main heating zone 4 have nearly the same structure as each other, but the hot air blowing heaters 7 installed in the main heating zone have a narrower width in the direction of transport than the hot air blowing heaters 6 installed in the preheating zone. A pair of cooling mechanisms 8, 8 of unillustrated structure is installed in the cooling zone 5. They carry out cooling by, for example, blowing a cooling gas at a printed circuit board which has been soldered. A conveyor 9 which transports a printed circuit board P in the direction from the preheating zone 3 towards the cooling 5 (arrow X) runs inside the muffle 2.

Next, the hot air blowing heaters installed in a reflow furnace according to the present invention will be explained. Since the hot air blowing heaters installed in the preheating zone and the hot air blowing heaters installed in the main heating zone have essentially the same structure, an explanation will be given of the hot air blowing heaters installed in the preheating zone. The hot air blowing heaters are installed in the upper and lower portions of the muffle, so the hot air blowing heaters do not have a top or bottom, but in explaining the hot air blowing heater shown in the drawings, it will be assumed that the heater is installed in the lower portion of the muffle, with top and bottom being as shown in the drawings.

As shown in FIGS. 2 and 3, each hot air blowing heater 6 is box-shaped and is divided in the vertical direction into four chambers. From the bottom, these four chambers are a blowing chamber 10, a heating chamber 11, a hot air chamber 12, and a suction chamber 13.

A fan 14 is installed in the center of the blowing chamber 10. This fan is a sirocco fan which is connected to a motor 15 disposed on the exterior. Partitions 16 (one of which is not shown) are provided on both sides of the blowing chamber 10.

An opening 17 is formed in one end of each partition. The openings in the partitions are not positioned opposite each other but instead are at opposite end portions.

Passageways 18, 18 are formed on both sides of the heating chamber 11, and a plurality of electric heaters 19 is installed inside the heating chamber. A suction hole 21 is formed in a partition 20 separating the heating chamber 11 from the blowing chamber 10. The suction hole is immediately above the fan 14, and its diameter is slightly smaller than the diameter of the fan in the form of a sirocco fan.

The hot air chamber 12 communicates with the above-described openings 17 in the blowing chamber 10, and hot blown air is sent to the hot air chamber 12 from the blowing chamber 10. A partition 22 extends between the hot air chamber 12 and the suction chamber 13, and the suction chamber 13 communicates with the heating chamber 11 via the passageways 18. The top of the suction chamber 13 forms a surface, i.e., a heater surface 23.

A large number of zigzag-shaped discharge nozzles 24 are erected atop the partition 22 and extend through the surface 23. Hot air from the hot air chamber is blown upwards through these nozzles as shown by the arrows. Thus, the discharge nozzles 24 communicate with the discharge side of the fan 14. The discharge nozzles 24 project upwards beyond the top of the surface 23. Suction ports 26 for hot air are provided in the vicinity of the discharge nozzles 24. The suction ports 26 are located in the same plane as the surface 23.

The hot air blowing heater shown in FIGS. 4-6 is a mode having plate-shaped nozzles constituted by two opposing plates. The two plates forms a discharge port, i.e., a nozzle, in the shape of a groove to constitute a type of slit nozzle.

In the illustrated example, zigzag-shaped suction ports 25 in the form of a plurality of strips are provided in locations adjacent to the discharge nozzles 24 projecting from the surface 23, i.e., in locations slightly separated from the discharge nozzles 24. See FIG. 4.

As shown in the partial enlarged plan view and the cross-sectional view in FIG. 5 and FIG. 6, respectively, the suction ports 25 and discharge nozzles 24 are installed so as to extend across the direction of travel of a printed circuit board (shown by the hollow arrow X in the drawings). As also shown in the drawings, the discharge nozzles 24 and suction ports 25 are formed to as to alternate with each other. Each zigzag-shaped discharge nozzle 24 has the same period as the adjoining zigzag-shaped discharge nozzles 24, i.e., the distance between respective peaks and the distance between respective valleys are the same. The suction ports 25 are connected to the heating chamber 11 and the suction hole 21 by means of the passageways 18 shown in FIG. 3. Thus, the suction ports 25 communicate with the suction side of the fan 14.

The surface 23 of the hot air blowing heater 6 is a metal plate made of aluminum, stainless steel, steel, or the like, and its top surface may be coated with a black ceramic 27. See FIGS. 2 and 3. If the surface 23 of the suction plate is covered with a black ceramic, when the suction plate is heated by hot air, far infrared rays are irradiated from the black ceramic, and a printed circuit board is heated by the heat of hot air as well as by far infrared rays, so heating is more uniform than with just hot air heating.

Next, discharge and suction of hot air in a reflow furnace having the above-described structure will be explained while referring to FIGS. 1-4.

When electric current is passed through the electric heaters 19 installed in the heating chamber 11 and the motor 15 is driven to rotate the fan 14, which is a sirocco fan, the gas contained in the heating chamber 11 is heated by the electric heaters 19 and becomes high temperature hot air, which is sucked by the fan 14 into the blowing chamber 10 from the suction side of the fan. The hot air which is sucked into the blowing chamber 10 is sent by the fan 14 from the discharge side of the fan through the openings 17 into the hot air chamber 12, and it is discharged from the zigzag-shaped discharge nozzles 24 which are provided in multiple strips or rows in the direction crossing the direction of travel of a printed circuit board. A printed circuit board P is moved inside the muffle 2 by the conveyor 9. Hot air blown from the discharge nozzles 24 contacts the traveling printed circuit board P, and the printed circuit board is heated. On the printed circuit board which is heated by hot air, solder paste which was applied to portions to be soldered melts, and the printed circuit board and electronic parts are soldered to each other. The zigzag-shaped discharge nozzles 24 rise above surface 23, so there are no portions whatsoever of the printed circuit board which are not contacted by hot air, and all portions thereof are uniformly heated by hot air. Accordingly, localized overheating or failure of the solder paste to melt does not occur.

The hot air which is discharged from the discharge nozzles is robbed of heat by the printed circuit board, so its temperature decreases. Hot air which has decreased in temperature in this manner is sucked into the suction ports 25 in the vicinity of where the discharge nozzles 24 are erected and enters the heating chamber 11 through passageways 18. The hot air which enters the heating chamber 11 is heated and raised in temperature to a prescribed temperature by the electric heaters 19, and it is sucked by the fan 14 into the blowing chamber 10. The hot air is then sent from the openings 17 to the hot air chamber 12, and it is again discharged from the discharge nozzles 24 to heat a printed circuit board.

In a reflow furnace according to the present invention, after hot air which is discharged from the discharge nozzles which project from the suction plate heats a printed circuit board, it is sucked in through the suction ports in the immediate vicinity of the discharge nozzles, so it does not interfere with the hot air discharged from other discharge nozzles. Accordingly, there is no turbulence inside the muffle and the oxygen concentration is stable in a reflow furnace according to the present invention.

Next, the hot air blowing heater shown in FIGS. 7-9 will be explained. In this example as well, a plate-shaped nozzle formed by two opposing plates constitutes a type of slit nozzle.

As can be seen from the partial enlarged partial plan view in FIG. 8, the hot air blowing heater shown in FIGS. 7-9 has zigzag-shaped suction ports 25 arranged in a plurality of strips in a surface 23, and discharge nozzles 24 are erected inside the suction ports. Namely, as can be seen from FIG. 9, open gaps are present on both sides of discharge nozzles 24, and these gaps form suction ports 25. The suction ports 25 and the discharge nozzles 24 are arranged in a zigzag shape which crosses the direction of travel of a printed circuit board (shown by the hollow arrow X). Of course, the zigzag-shaped suction ports 25 have the same period as the zigzag-shaped discharge nozzles 24, i.e., the distance between respective peaks and the distance between respective valleys are the same between the ports and the nozzles. The suction ports 25 are connected with the suction hole 21 through the passageways 18. See FIG. 2 and FIG. 3. Thus, the suction ports 25 communicate with the suction side of the fan 14.

The hot air blowing heater shown in FIGS. 7-9 operates in the same manner as the hot air blowing heater shown in FIGS. 4-6, so a detailed explanation on operation will be omitted.

The present invention has been explained with respect to a mode in which discharge nozzles and suction ports are continuously arranged in a zigzag shape in a direction crossing the direction of travel of a printed circuit board, but the discharge nozzles need not be continuous. Namely, as partially shown in the enlarged plan views of FIGS. 10 and 11, the heating effect is not adversely affected if zigzag-shaped discharge nozzles are each divided into a plurality of nozzles. FIGS. 10 and 11 show variations of FIG. 7 and FIG. 4, respectively. A nozzle can be divided into a plurality of nozzles by combining a large number of rectangular pipes 26. Their length, size, and other features can be suitably selected. As shown in the figures, forming a zigzag shape in divided discharge nozzles from a large number of rectangular pipes is easier than forming a continuous zigzag-shaped discharge nozzle. In this specification, such divided-nozzle mode is encompassed by the term "plate-shaped nozzle".

FIGS. 12 and 13 show an example of a variation of FIG. 10 in which round pipes are used instead of the above-described rectangular pipes. A plurality of discharge nozzles 24 in the form of round pipes are disposed in series in each of suction ports 25 which are provided in a zigzag shape in the direction crossing the direction of travel of a printed circuit board. FIG. 13 is an enlarged view of a portion of FIG. 12. In the illustrated example, the arrangement of the discharge nozzles 24 constituted by round pipes with respect to direction of travel of a printed circuit board is the same for each strip of suction port 25a and 25b.

As shown in FIG. 12, a plurality of the zigzag-shaped suction ports 25 are formed. The zigzag shape of the suction ports 25 crosses the direction of travel of a printed circuit board (shown by the hollow arrow X). Each zigzag-shaped suction port is arranged such that its peaks and valleys fit into the valleys and peaks of the adjoining zigzag-shaped suction ports. As shown in the enlarged view of FIG. 13, the peaks $25ay$ of one strip $25a$ of the zigzag-shaped suction ports 25 interfit with the valleys $25bt$ of the adjoining strip $25b$ of the zigzag-shaped suction ports 25, and the peaks $25by$ of the adjoining strip $25b$ of the zigzag-shaped suction ports 25 fit into the valleys $25at$ of the first strip $25a$ of the zigzag-shaped suction ports 25. Accordingly, the discharge nozzles 24 which are erected within a suction port 25 are positioned so as to overlap the discharge nozzles within the adjoining suction ports in the direction of travel of a printed circuit board. The suction ports 25 are connected to the suction hole 21 through the passageways 18. Thus, the suction ports 25 communicate with the suction side of the fan 14.

Next, another mode of the present invention will be explained while referring to FIGS. 14-17. In this mode, a plate-shaped nozzle is formed by a solid plate having nozzle holes bored therein. The structure is otherwise the same as that described above.

Figure 14:
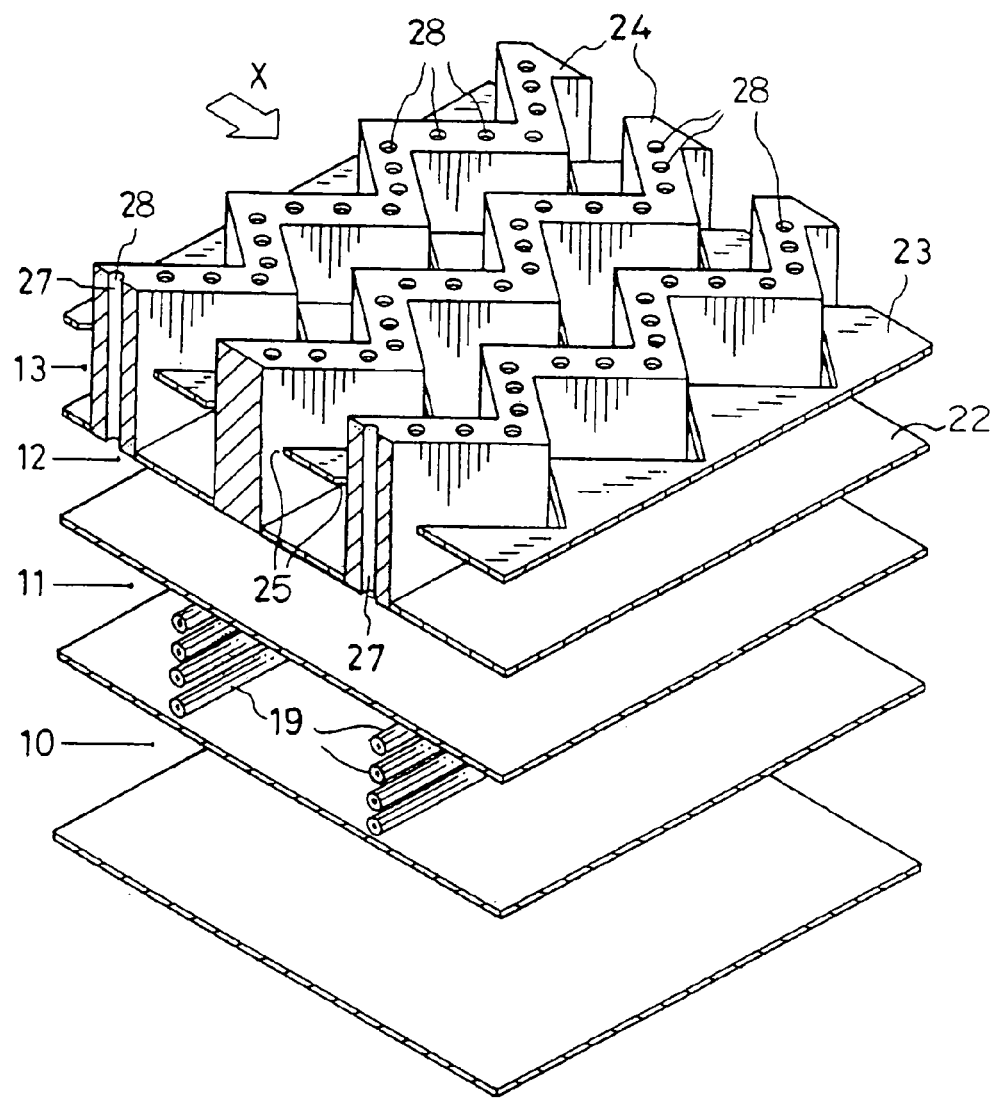
FIG. 14 is a perspective view of a portion of a hot air blowing heater installed in a reflow furnace according to the present invention.
Figure 15:
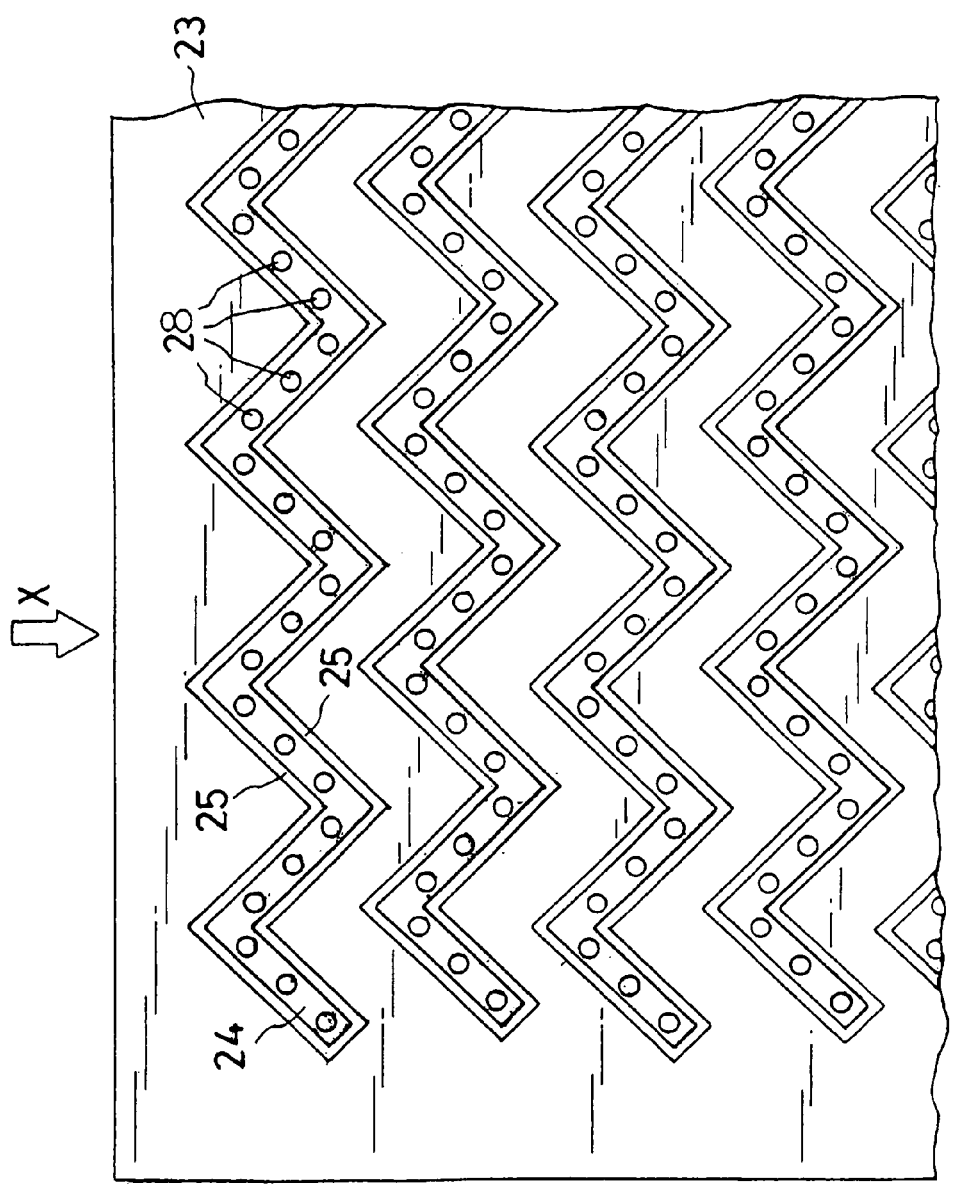
FIG. 15 is a plan view of FIG. 14.
Figure 16:
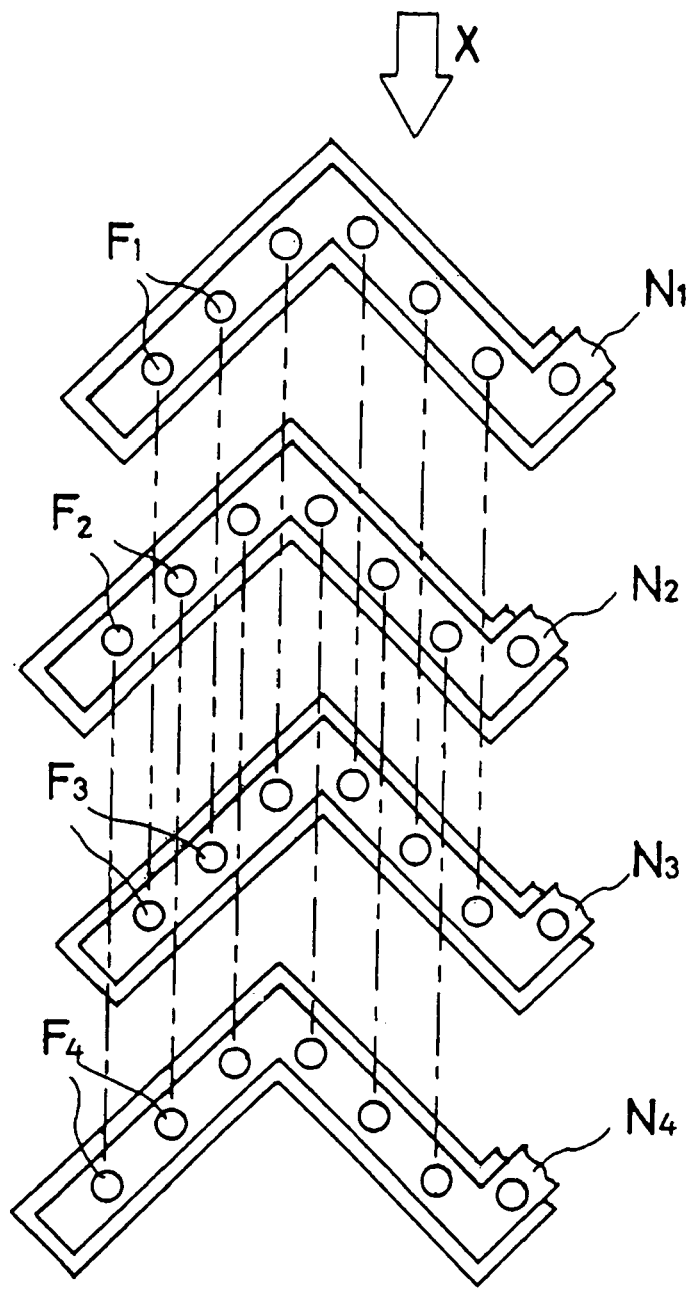
FIG. 16 is an enlarged view of a portion of FIG. 15.

FIG. 14 is a perspective view of a portion of a hot air blowing heater in another mode of a reflow furnace according to the present invention. FIG. 15 is a partial plan view of FIG. 14, FIG. 16 is a partial enlarged view of FIG. 15, and FIGS. 17(A), (B), and (C) are schematic explanatory views for explaining the heating of a printed circuit board.

In this example, as shown in FIGS. 14 and 15, a number of zigzag-shaped plate-shaped nozzles 24 are erected on a partition 22 and project upwards from a heater surface 23. As shown in FIGS. 14 and 15, the nozzles are disposed so as to extend in a zigzag shape in a direction crossing the direction of travel of a printed circuit board (shown by the hollow arrow X). Through holes 27 are provided in the interior of the nozzles 24 so that a large number of discharge holes 28 are formed in the top surfaces of the nozzles. Suction ports 25 are formed alongside the nozzles 24 on both sides thereof. As is the case in FIG. 4, it is also possible for each suction port 25 to be provided between one plate-shaped nozzle 24 and another plate-shaped nozzle 24.

The discharge holes bored in the nozzles are positioned so as not to be aligned with the discharge holes in the adjoining plate-shaped nozzle in the direction of travel of a printed circuit board. The discharge holes 28 in this embodiment are not aligned with the discharge holes 28 of the plate-shaped nozzle of the adjoining strip but are aligned with the discharge holes of the plate-shaped nozzle one strip away. Thus, as shown in FIG. 16, if the plate-shaped nozzles are successively $N_1$, $N_2$, $N_3$, and $N_4$ in the direction of travel of a printed circuit board (the direction shown by the hollow arrow X), the positions of the discharge holes in the plate-shaped nozzles are such that the discharge holes $F_1$ bored in plate-shaped nozzle $N_1$ are not aligned with the discharge holes $F_2$ of the adjoining plate-shaped nozzle $N_2$ in the direction of travel of a printed circuit board but are aligned with the discharge holes $F_3$ in plate-shaped nozzle $N_3$ separated by plate-shaped nozzle $N_2$ (as shown by the two-dash lines in FIG. 16). Similarly, the discharge holes $F_2$ in plate-shaped nozzle $N_2$ are bored so as to be aligned with the discharge holes $F_4$ in plate-shaped nozzle $N_4$ which is separated by one nozzle (as shown by the one-dash lines in FIG. 16). In this figure, the hollow arrow X indicates the direction of travel of a printed circuit board.

Next, heating of a printed circuit board in a reflow furnace according to the present invention will be explained with respect to FIGS. 17(A), (B), and (C).

As shown in FIGS. 17(A), (B), and (C), the zigzag-shaped plate-shaped nozzles which are arranged in multiple strips in the direction of travel of a printed circuit board P (shown by arrow X) are $N_1$, $N_2$, $N_3$, $N_4$, etc. These plate-shaped nozzles project from a heater surface H, so after hot air which is blown from plate-shaped nozzles $N_1$ and $N_2$ strikes a printed circuit board P and heats the printed circuit board, it is deflected from the printed circuit board and sucked into suction ports S in the heater surface H. Accordingly, when a printed circuit board arrives below plate-shaped nozzles $N_1$ and $N_2$ as shown in FIG. 17(A), the region surrounded by plate-shaped nozzles $N_1$ and $N_2$, the heater surface H, and the printed circuit board P is formed into a heating region K, by the hot air which is deflected from the printed circuit board. As shown in FIG. 17(B), when the printed circuit board arrives below plate-shaped nozzles $N_2$ and $N_3$, the region surrounded by plate-shaped nozzles $N_2$ and $N_3$, the heater surface H, and the printed circuit board becomes a heating region $K_2$. Similarly, when the printed circuit board arrives below plate-shaped nozzles $N_3$ and $N_4$, the region surrounded by plate-shaped nozzles $N_3$ and $N_4$, the heater surface H, and the printed circuit board becomes a heating region $K_3$.

The printed circuit board P is transported by an unillustrated conveyor, and its temperature before the printed circuit board is heated by the plate-shaped nozzles is $T_0$. When the front of the printed circuit board P reaches plate-shaped nozzle $N_2$, the front portion of the printed circuit board is heated in the heating region K, formed by the hot gas discharged from plate-shaped nozzles $N_1$ and $N_2$, and the temperature of the front portion increases from $T_0$ to $T_1$. Next, when the front portion of the printed circuit board reaches plate-shaped nozzle $N_3$, the front portion of the printed circuit board is heated in heating region $K_2$, and the temperature of the front portion increases from $T_1$ to $T_2$. Similarly, the front portion of the printed circuit board is heated in heating region $K_3$ and the temperature of the front portion increase from $T_2$ to $T_3$. Thus, in a reflow furnace according to the present invention, heating regions are formed between plate-shaped nozzles, and the temperature of a printed circuit board successively increases in the heating regions.

At this time, the discharge holes bored in plate-shaped nozzle $N_1$ are separated from each other, so the temperature increases immediately below the discharge holes, but the temperature becomes lower in portions between the holes. However, the discharge holes bored in plate-shaped nozzle $N_2$ are between the discharge holes bored in $N_1$, so when the front portion of a printed circuit board reaches plate-shaped nozzle $N_2$, the portions which were not adequately heated by $N_1$ are heated to the same temperature as those portions which were increased in temperature by heating by $N_1$. Accordingly, a printed circuit board which passes plate-shaped nozzles $N_1$, $N_2$, $N_3$, $N_4$, ... $N_n$ is uniformly heated over its entirety when it passes the last nozzle $N_n$.

Figure 17:
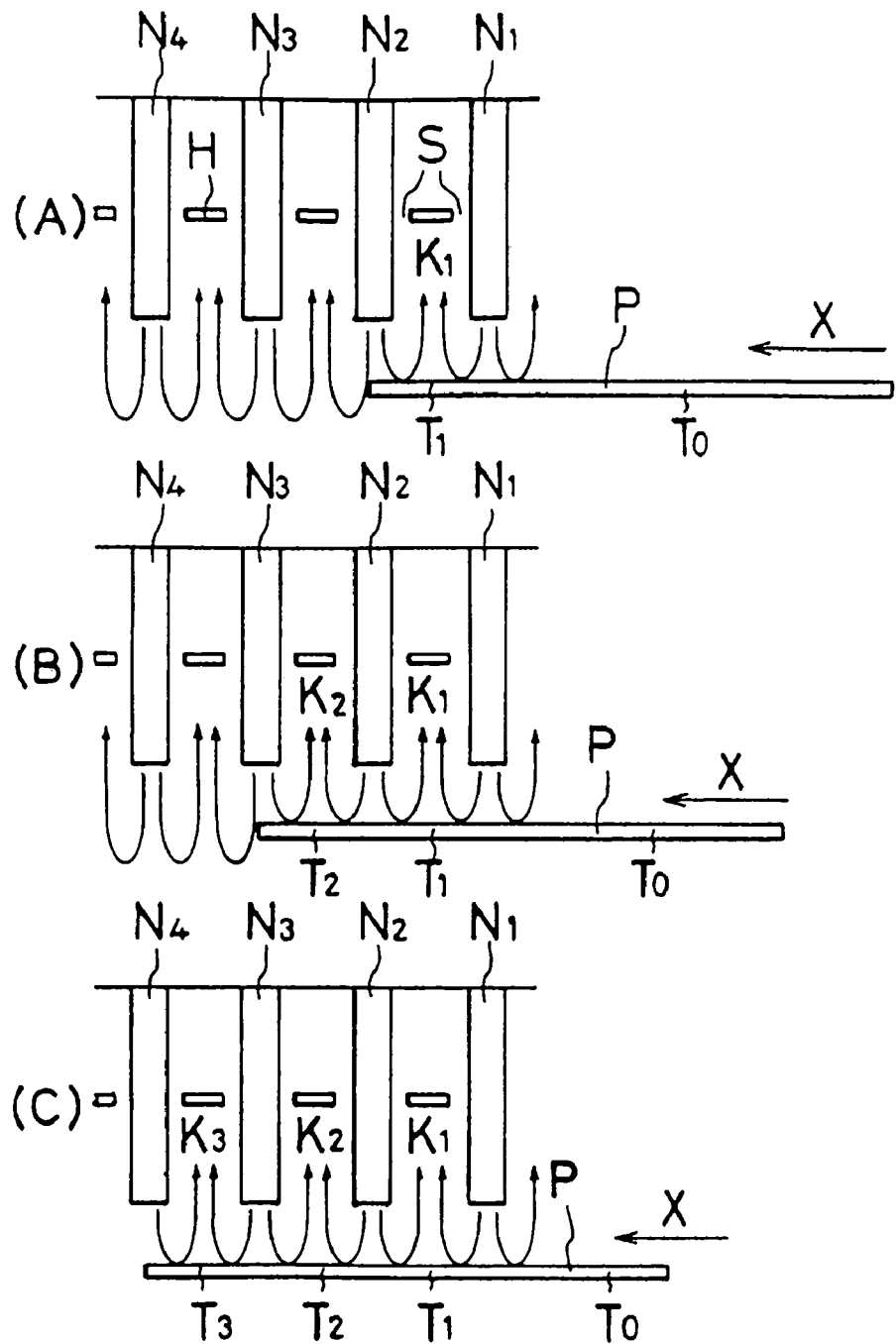
FIGS. 17(A), (B), and (C) are schematic explanatory views explaining heating of a printed circuit board.

FIG. 17 was explained with respect to plate-shaped nozzles having discharge holes, but it can be readily understood that the manner of heating is nearly the same in other modes of the present invention.

INDUSTRIAL APPLICABILITY

A reflow furnace according to the present invention does not have turbulence of hot air, so it provides excellent effects in an inert gas reflow furnace having a muffle filled with inert gas. However, since the present invention can uniformly heat the entirety of a printed circuit board, it can of course be utilized in a reflow furnace operating in air.

The invention claimed is:

1. A reflow furnace comprising a preheating zone, a main heating zone, and a cooling zone and having at least one heater provided in the upper portion or the upper and lower portions of the preheating zone and the main heating zone, wherein the heater comprises a hot air blowing heater having a fan and an electric heater inside it and having a plurality of discharge nozzles in its front surface, the discharge nozzles project from a front surface of the hot air blowing heater, the hot air discharge nozzles are arranged in a zigzag shape crossing the direction of travel of a printed circuit board, hot air suction ports which extend across the direction of travel of the printed circuit board are provided in the vicinity of the hot air discharge nozzles, the suction ports communicate with the suction side of the fan, and the discharge nozzles communicate with the discharge side of the fan.

2. A reflow furnace as claimed in claim 1 wherein the hot air discharge nozzles are provided in the form of a plurality of strips in the direction of travel of a printed circuit board, and zigzag-shaped peaks and valleys of each hot air discharge nozzle fit into zigzag-shaped valleys and peaks of the hot air discharge nozzle of an adjoining one of the strips.

3. A reflow furnace as claimed in claim 1 wherein the suction ports are provided in a zigzag shape crossing the direction of travel of a printed circuit board.

4. A reflow furnace as claimed in claim 1 wherein the suction ports are continuously provided in a zigzag shape crossing the direction of travel of a printed circuit board, and a series of discharge nozzles are erected inside the zigzag-shaped suction ports.

5. A reflow furnace as claimed in claim 1 wherein the suction ports are arranged in a zigzag shape adjoining the discharge nozzles.

6. A reflow furnace as claimed in claim 1 wherein the suction ports are provided in a zigzag shape extending parallel to the discharge nozzles.

7. A reflow furnace as claimed in claim 1 wherein the front surface of the heater is coated with a black ceramic which radiates far infrared rays at a high temperature.

8. A reflow furnace as claimed in claim 1 wherein the discharge nozzles are formed as a series of pipes having a rectangular transverse cross section.

9. A reflow furnace comprising a preheating zone, a main heating zone, and a cooling zone, wherein nozzles which form a plurality of strips and project from a heater surface are arranged in the upper portion or the upper and lower portions of the preheating zone and the main heating zone in a zigzag shape crossing the direction of travel of a printed circuit board, suction ports are formed in the heater surface between the nozzles extending in a direction crossing the direction of travel of a printed circuit board, a large number of spaced hot air discharge holes are formed in the nozzles, the discharge holes of the nozzle in each strip are not aligned in the direction of travel of a printed circuit board with the discharge holes in the nozzle in an adjoining strip but are aligned with the discharge holes in a nozzle separated by at least one strip.

10. A reflow furnace as claimed in claim 9 wherein the suction ports are formed in a zigzag shape alongside the nozzles.

11. A reflow furnace as claimed in claim 9 wherein the suction ports are formed in a zigzag shape approximately midway between nozzles.

12. A reflow furnace as claimed in claim 9 wherein the suction ports are slits formed in the heater surface.

* * * * *